(12) United States Patent
Houben et al.

(10) Patent No.: US 9,211,567 B2
(45) Date of Patent: Dec. 15, 2015

(54) METHOD AND APPARATUS FOR APPLYING A MATERIAL ON A SUBSTRATE

(75) Inventors: René Jos Houben, Nederweert (NL); Gerrit Oosterhuis, Best (NL)

(73) Assignee: Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 907 days.

(21) Appl. No.: 12/669,185

(22) PCT Filed: Jul. 16, 2008

(86) PCT No.: PCT/NL2008/050489
§ 371 (c)(1),
(2), (4) Date: May 17, 2010

(87) PCT Pub. No.: WO2009/011583
PCT Pub. Date: Jan. 22, 2009

(65) Prior Publication Data
US 2010/0313947 A1  Dec. 16, 2010

(30) Foreign Application Priority Data

Jul. 16, 2007  (EP) .................................... 07112576
Aug. 13, 2007  (EP) .................................... 07114232

(51) Int. Cl.
*B05D 3/00* (2006.01)
*B05D 7/24* (2006.01)
(Continued)

(52) U.S. Cl.
CPC . *B05D 7/24* (2013.01); *C23C 18/08* (2013.01); *C23C 18/14* (2013.01);
(Continued)

(58) Field of Classification Search
CPC ................ B41J 2/14; B41J 2/13; B41J 2/015; B41J 2/215; B05D 7/24
USPC .............. 427/58, 96.1, 96.7, 97.1, 97.2, 97.3, 427/561, 596, 565, 567, 597, 446, 453, 427/455; 118/308, 310, 641, 46, 45, 621
See application file for complete search history.

(56) References Cited

U.S. PATENT DOCUMENTS 4,281,332 A * 7/1981 Horike .............................. 347/6
5,108,785 A * 4/1992 Lincoln et al. ................ 427/555
(Continued)

FOREIGN PATENT DOCUMENTS

EP          1613136          1/2006
EP          1613136 A1 *   1/2006
(Continued)

OTHER PUBLICATIONS

International Search Report, Application No. PCT/NL2008/050489, mailed Dec. 3, 2008.
(Continued)

*Primary Examiner* — Michael Wieczorek
(74) *Attorney, Agent, or Firm* — Renner, Otto, Boisselle & Sklar, LLP

(57) ABSTRACT

The invention provides a method for applying a material onto a substrate using a droplet printing technique wherein a gas stream is released into the direction of a substrate, which gas stream comprises a carrier gas and droplets of a suspension of the material or droplets of a solution of a precursor of the material or droplets of a precursor of the material as such, whereby the droplets in the gas stream are first maintained in a steady flow and subsequently in a converging flow before the droplets are contacted with the substrate. The invention further provides an apparatus for carrying out said method.

24 Claims, 1 Drawing Sheet

(51) Int. Cl.
*C23C 18/08* (2006.01)
*C23C 18/14* (2006.01)
*H01L 31/0224* (2006.01)
*H05K 3/12* (2006.01)
*H05K 3/10* (2006.01)

(52) U.S. Cl.
CPC ....... *H01L 31/022425* (2013.01); *H05K 3/125* (2013.01); *H05K 3/105* (2013.01); *H05K 2203/013* (2013.01); *H05K 2203/086* (2013.01); *Y02E 10/50* (2013.01); *Y10T 428/24802* (2015.01)

(56) References Cited

U.S. PATENT DOCUMENTS

| | | | | |
|---|---|---|---|---|
| 5,798,774 | A * | 8/1998 | Okada et al. | 347/21 |
| 6,336,708 | B1 * | 1/2002 | West et al. | 347/47 |
| 6,675,957 | B2 * | 1/2004 | Greive et al. | 198/835 |
| 7,108,894 | B2 * | 9/2006 | Renn | 427/596 |

FOREIGN PATENT DOCUMENTS

| WO | 9731779 | 9/1997 |
|---|---|---|
| WO | 2004018212 | 3/2004 |

OTHER PUBLICATIONS

Flagan et al., "Fundamentals of Air Pollution Engineering", Prentice Hall, 1988, 80 pages.

\* cited by examiner

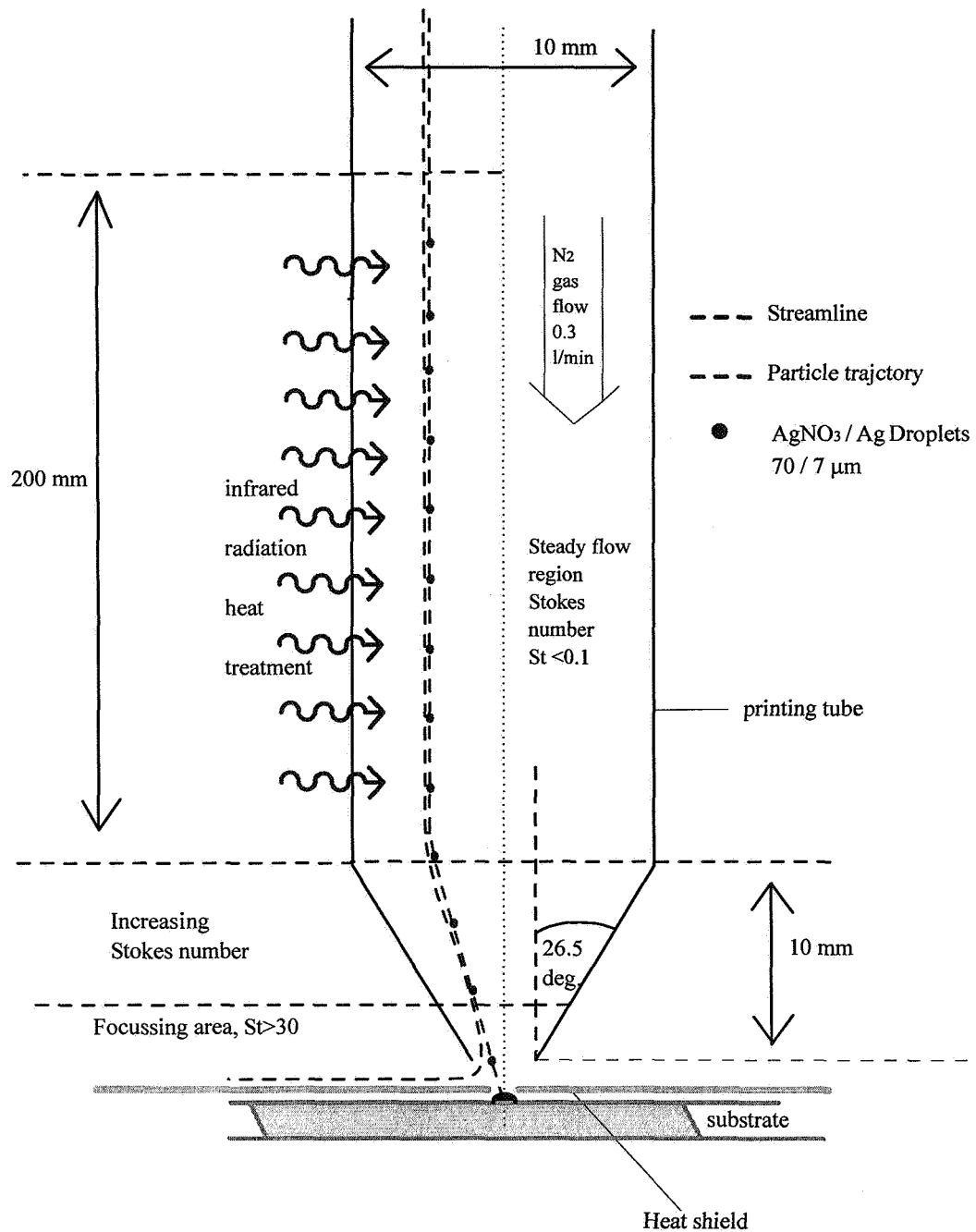
Schematic lay-out of an example realisation of the current invention

METHOD AND APPARATUS FOR APPLYING A MATERIAL ON A SUBSTRATE

This application is a national phase of International Application No. PCT/NL2008/050489 filed Jul. 16, 2008.

The present invention relates to a method for applying a material onto a substrate using a droplet printing technique, and an apparatus for carrying out such a method.

Droplet printing techniques are nowadays widely applied for the formation of two-dimensional bodies and three-dimensional bodies using computer-generated design data. In general either a continuous droplet printing technique or a drop-on-demand droplet printing technique will be used. In the former technique a back-pressure is applied to the reservoir of liquid material to be used, whereby mechanical vibration is constantly used to produce a stream of small uniform droplets. This technique applies a high constant frequency, allowing the droplets to be produced at rates of thousands of droplets per second. The drop-on demand techniques differs, however, from the former technique in that pulsation is applied only when needed, thus allowing droplets to be produced on demand, from single droplets to several hundreds or thousands of droplets per second.

Typical two-dimensional bodies include films such as electrical insulators and semiconductors, whereas three-dimensional bodies include a large variety of products such as functioning prototypes, moulds, tools and articles. Materials that can suitably be used in these applications include polymers, metals and ceramic materials.

A problem associated with metal droplet printing techniques is that the formation of small metal droplets requires the use of a small tube in the droplet generator, which tube is unfortunately sensitive to blockage by the metal droplets. In addition, it is noted that molten metal is aggressive in the sense that it causes the formation of corrosion products, which in turn contributes to the blockage problem. Obviously, this problem increases when molten metals are used having a higher melting point, since such molten metals behave more aggressively.

In an alternative droplet printing technique used in the manufacture of two-dimensional bodies, droplets consisting of a dry organometallic compound dissolved in an organic solvent are deposited on a substrate and after a layer of the droplets has been formed on the surface of the substrate, the layer is subjected to a heating treatment wherein pyrolysis of the organometallic compound takes place to allow a metal layer to be formed on the surface of the substrate. Since for each individual layer of droplets such heat treatment is required, it will be clear that such technique is time-consuming as well as expensive. An additional and more severe drawback is, however, the fact that the entire substrate needs to be heated for the pyrolysis of the organometallic compound. Consequently, the substrate needs to be heat resistant, which limits this technique significantly because it excludes the application of many combinations of substrates and printing materials.

In other known printing techniques droplets of a suspension of a material or droplets of a solution of a precursor of a material to be deposited on the substrate are treated over a relatively long distance, after their release, so as to chemically alter the droplets by inducing reactions to take place or to physically alter the droplets, for instance, by heating the droplets.

Such treatment techniques have, however, the drawback that they lower the precision with which the droplets will be deposited at the substrate (i.e. focusing accuracy).

Object of the present invention is to provide a droplet printing technique which displays an improved focusing accuracy, despite the fact that the droplets are transported over a relatively long distance.

Surprisingly, it has now been found that this can be established when use is made of a method in which the droplets are initially maintained in a steady flow and subsequently in a converging flow. Accordingly, the present invention relates to a method for applying a material onto a substrate using a droplet printing technique and a gas stream guiding system, which method comprises the steps of:

(a) releasing a gas stream which comprises a carrier gas and droplets of a suspension of the material or droplets of a solution of a precursor of the material or droplets of a precursor of the material as such into the direction of the substrate, whereby the droplets are produced using a droplet printing technique;

(b) maintaining a steady flow of the gas stream over a first period of time, wherein the Stokes number (St) of the droplets in the gas stream is less than 1 during the first period of time;

(c) converting the steady flow of the droplets in the gas stream into a converging flow and maintaining the converging flow of the droplets over a second period of time, whereby the Stokes number of the droplets in the gas stream increases up to a value higher than 10 during the second period of time; and (d) contacting the droplets of the suspension of the material so obtained or the droplets of a solution of a precursor of the material so obtained with the substrate.

The method in accordance with the present invention allows a high aerodynamic focusing accuracy of the droplets resulting in products of high precision when compared to known products made by conventional droplet printing techniques.

Preferably, in step (b) the Stokes number of the gas stream is less than 0.1 during the first period of time.

In step (c) the Stokes number of the droplets in the gas stream increases preferably up to a value higher than 10 during the second period of time. More preferably, in step (c) the Stokes number of the droplets in the gas stream increases up to a value higher than 20 during the second period of time. Most preferably, in step (c) the Stokes number of the droplets in the gas stream increases up to a value higher than 30 during the second period of time.

It will be appreciated that the Stokes number (St) of a particle in a gas flow, in our case droplets, is defined as follows:

$$St = \frac{\rho_p D_p^2 C_c U_o}{18 \mu_f L_c}$$

wherein $\eta_p$ is the particle density; $D_p$ the particle diameter; $C_c$ the correction factor (=1); $U_o$ is the characteristic velocity; $\mu_f$ is the fluid viscosity; and $L_c$ is the typical length scale.

In step (c), the conversion of the steady flow into a converging flow can suitably be established by using a gas stream guiding system which comprises a first part having essentially the same diameter over essentially its entire length, and a second part having a converging diameter over essentially its entire length.

Preferably, the first part has the same diameter over more than 70% of its entire length, and the second part has a converging diameter over more than 70% of its entire length.

More preferably, the first part has the same diameter over its entire length, and the second part has a converging diameter over its entire length.

In accordance with the present invention, the first period of time in step (b) can suitably be in the range of from 0.1-10 seconds. The second period of time in step (c) can suitably in the range of from 0.01-1 second.

Preferably, the precursor to be used in accordance with the present invention comprises a metal salt or an organometallic compound and the suspension comprises a metal suspension, a polymer suspension or a ceramic suspension. More preferably, a solution of a metal salt or a metal suspension is used. Most preferably, a solution of a metal salt is used. The metal salt constitutes the precursor of the corresponding metal to be obtained.

A wide range of metal salts can be used in accordance with the present invention. Suitable metal salts include those that have been derived from nickel, copper, gold, silver, platinum, aluminium, iron or palladium, preferably nickel or copper. Examples of such metal salts include metal nitrates or metal acetates, such as copper nitrate, copper acetate, nickel nitrate and nickel acetate.

An example of a suitable organometallic compound is for instance (1,5-cyclooctadiene-1,1,1,5,5,5-hexafluoroacetylacetonato)silver(I), also known as Ag(hfa)(COD).

Preferably, the metal to be used in accordance with the present invention comprises nickel, copper, gold, silver, platinum, iron, aluminium or palladium. More preferably, the metal comprises silver, nickel or copper.

Preferably, the polymer to be used in accordance with the present invention comprises polystyrene, polypropylene, polyethylene, or acrylonitrile butadiene styrene. More preferably, the polymer comprises polystyrene or polyethylene.

Preferably, the ceramic suspension to be used comprises a ceramic material selected from the group consisting of aluminium oxide, zirconium oxide, magnesium oxide, boron nitride, silicon carbide, silicon nitride and tungsten carbide. More preferably, the ceramic material comprises aluminium oxide or zirconium oxide. More preferably, use is made of zirconium oxide.

Obviously, in the solution or suspension to be used in accordance with the present invention a liquid medium is used.

Suitable examples of such liquid media used in solutions of metal salts include water, alcohol and acetone, or mixtures thereof. Preferably, the liquid medium used in a solution of a metal salt comprises water.

When use is made of an organometallic compound suitable liquid media include toluene and ethanol.

The liquid medium used in the polymer suspension suitably comprises water, alcohol or acetone. Preferably, the liquid medium used in the polymer suspension comprises water. If desired, mixtures of these liquid media can be applied.

The liquid medium use in the ceramic suspension suitably comprises water, alcohol or acetone. Preferably, the liquid medium used in the ceramic suspension comprises water. If desired, mixtures of these liquid media can be applied.

When the material to be deposited on the substrate comprises a polymer and droplets of a precursor of the material as such are used, the precursor of the material can suitably be a curable monomer from which the polymer will be formed.

The gas stream to be used in accordance with the present invention comprises a carrier gas and droplets of the material or droplets of a solution of a precursor of the material. Suitably, the carrier gas can be selected from the group consisting of nitrogen, hydrogen, argon or a mixture thereof.

Preferably, the carrier gas comprises nitrogen or argon. The gas can either be inert or it can function as a catalyst suitable for the treatment given to the droplets during flight.

In the method according to the present invention use can be made of two or more printing heads or two or more nozzles that each deliver a droplet stream, resulting in two or more droplet streams that flow in parallel in the direction of the substrate.

The droplets streams may all comprise one type of material or precursor of the material, or the respective droplet streams comprise different types of material or precursors of the material(s).

In a particular attractive embodiment of the present invention, the droplets of the suspension of the material or the droplets of the solution of the precursor of the material are at least subjected in step (b) to a treatment which delivers energy to the droplets. It will be understood that in respect of such a treatment some overlap may occur between steps (a) and (b), and (b) and (c) respectively. Hence, said treatment may also partly occur in step (a) or in step (c). Preferably, however, said treatment is substantially carried out in step (b). With the term "substantially" is meant that said treatment is carried out for more than 90% in step (b). Preferably, more than 95% of said treatment is carried out in step (b).

Preferably, such a treatment is carried out to establish:
(i) that the liquid medium used in the suspension is completely or substantially removed, whereby the material is allowed to melt when the liquid medium is removed completely; or
(ii) that the liquid medium used in the solution is completely removed, whereby pyrolysis of the precursor and melting of the material so obtained is allowed to take place when the precursor comprises a metal salt.

Suitably, the treatment which delivers energy to the droplets is selected from the group consisting of heat treatments, infrared curing treatments, flash curing treatments, UV radiation treatments, electron beam curing treatments, plasma treatments, induction treatment and laser irradiation treatments.

Preferably, said treatment is a heat treatment or a UV radiation treatment.

The droplets can suitably be heated by means of contact-free heating equipment, i.e. equipment which heats the droplets without being in direct contact with the droplets. Examples of such equipment include heating spirals, microwave devices in case aqueous solutions are used, laser heating and induction heating devices.

When the suspension to be used in accordance with the present invention comprises a metal suspension, a polymer suspension or a ceramic suspension, the liquid medium used in the suspension is preferably completely removed during the present process.

In accordance with the present invention a heat shield can suitably be applied above the side of the substrate which is to be contacted with the droplets. In this way the hot gas flow is directed away from the substrate.

When use is made of a polymer suspension, the droplets of the polymer solution are heated in such a way that the liquid medium used in the polymer suspension is completely removed and the polymer so obtained is melted in polymer droplets.

When a solution of a metal salt or an organometallic compound is used, the droplets of the solution are heated in such a way that pyrolysis of the metal salt or organometallic compound occurs and the metal thus obtained is melted into molten metal droplets. In case a metal suspension is used, the droplets of the metal suspension will be heated in such a way that the liquid medium used in the metal suspension is completely removed and the metal so obtained is melted in metal droplets.

When a ceramic suspension is used in the method according to the invention, the droplets of the ceramic suspension are heated in such a way that the liquid medium used in the ceramic suspension is substantially removed and the remaining droplets of the ceramic suspension are allowed to deposit on the substrate. In the context of the present invention with "substantially" is meant that at least 50% of the liquid medium used in the ceramic suspension is removed. Preferably, more than 70% of the liquid medium is removed, more preferably more than 80% of the liquid medium is removed.

It will be understood that when use is made of a heating treatment the droplets are exposed to a temperature, which is at least equal to the boiling temperature of the liquid medium used in the solution or the suspension. Preferably, the droplets are exposed to a temperature which is larger than the boiling temperature of the liquid medium used in the solution or the suspension.

When a solution of a metal salt or an organometallic compound is used or a metal suspension, the liquid medium will generally evaporate at a temperature in the range of from 50-200° C., whereas pyrolysis of the metal salt obtained from the solution will generally take place at a temperature in the range of from 100-1000° C., and the metal obtained from the suspension will generally melt at a temperature in the range of from 500-1500° C.

When a ceramic suspension or a polymer suspension are used the liquid medium will also generally evaporate at a temperature in the range of from 50-200° C., whereas the polymer obtained from the polymer suspension will generally melt at a temperature in the range of from 80-300° C.

On the other hand when mentioning these temperatures it does not mean that the gas stream has this temperature. The droplets inside the tube can be heated without heating the gas. As mentioned before one can think of microwave or induction heating. Even with conventional heating methods the irradiation towards the droplet will be higher then to the gas enabling a relatively cold gas steam making this system capable of positioning droplets on delicate substrates.

It will be understood that said temperature ranges will depend on the choice of the liquid medium applied and the pressure used.

In accordance with the present invention a variety of substrates can suitably be used. Examples of suitable substrates include metals, polymers and ceramics. One of the major advantages of the present invention is the fact that also variety of low melting substrates can suitably be used. Suitable examples of low melting substrates include polymers such as polyethylene, and polystyrene.

The droplet printing technique to be used in accordance with the present invention can either be a continuous droplet printing technique or a drop-on-demand droplet printing technique. Preferably, however, use is made of a drop-on-demand printing technique.

The method according to the present invention can also very attractively be used to fill vias which are present in electronic devices. Suitable electronic devices include printed circuit boards, chips and integrated circuits.

The present invention also relates to the use of a method according to the present invention for the production of conductors on printed circuit boards or solar cells.

In addition, the present invention provides a printed circuit board or solar cell which comprises a conductor which has been produced by means of a method according to the present invention.

The present invention further relates to a substrate on which a material has been applied obtainable by means of any of the methods according to the present invention. The materials which have been applied onto such substrates display a unique structure which is established by means of the improved focusing accuracy. Preferred substrates in accordance with the present invention are obtainable by means of a method according to the present in which use is made of two or more printing heads or two or more nozzles that each deliver a droplet stream, resulting in two or more droplet streams that flow in parallel in the direction of the substrate. In that way very attractive substrates can be produced on which, for example, a layer of an alloy is applied, which alloy is formed on the substrate itself.

The present invention also relates to a product which has been manufactured by using the method according to the present invention until the desired form of the product is shaped.

Products that can be manufactured using the method according to the present invention include two-dimensional and three-dimensional bodies, electrical conductors, electrical insulators, semiconductors, functioning prototypes, moulds, tools and a large variety of articles such as custom jewellery, conductive tracks such as for instance those on printed circuit boards, solar cells, custom made medical implants, and small complex engineering parts such as pump rotors.

The present invention also relates to an apparatus for carrying out a method according to the present invention, which apparatus comprises:
(a) a reservoir for a suspension of the material or a solution of a precursor of the material;
(b) a printing head for releasing droplets of the suspension or the solution, which printing head is connected to the reservoir;
(c) a gas stream guiding system which comprises a first part having essentially the same diameter over essentially its entire length, and a second part having with a converging diameter over essentially its entire length.

Preferably, the first part has the same diameter over more than 70% of its entire length, and the second part has a converging diameter over more than 70% of its entire length.

More preferably, the first part has the same diameter over its entire length, and the second part has a converging diameter over its entire length. Suitably the tube diameter at the start of the converging flow is 8-12 times larger than the tube diameter at the end of the converging flow, i.e. at the orifice of the tube. To establish this, the diameter of the second part converges over the length of said part in respect of the central axis of said second part in an angle in the range of from 5-90°. More preferably, between 10° and 90°, most preferably between 10-60°.

Suitably, the first part has a length that allows sufficient time and space for said treatment which delivers energy to the droplets and which is suitably selected from the group consisting of heat treatments, infrared curing treatments, flash curing treatments, UV radiation treatments, electron beam curing treatments, plasma treatments, induction treatment and laser irradiation treatments.

Suitably, the first part has a length in the range of 1-500 cm. Preferably, the first part has a length in the range of from 1-100 cm.

Suitably, the first part has a diameter in the range of 0.5 to 50 mm. Preferably, the first part has a diameter in the range of from 0.5 to 5 mm.

Suitably, the second part has a length in the range of from 0.5-50 cm. Preferably, the second part has a length in the range of from 0.5-10 cm.

In a particular attractive embodiment the present apparatus further comprises a device for delivering energy to inner part of the first part of the gas stream guiding system. Examples of such devices include heating spirals, microwave devices in case aqueous solutions are used, laser heating and induction heating devices.

Example

FIG. 1 shows the schematic lay-out of an example realisation of the current invention. In this particular example, 70 μm droplets of an aqueous solution of $AgNO_3$ are printed with a drop-on-demand print head. Droplets are guided by a flow of $N_2$ gas with a flow of 0.3 l/min. During the first part of the flow (straight part), the droplets are heated by IR-radiation. As a result, the water evaporates, subsequently pyrolysis takes place leading to 7 μm molten Ag droplets. The lower part of the tube contracts with an angle of 26.5°, which yields a focussing accuracy of 5-20 μm.

The invention claimed is:

1. A method for applying a material onto a substrate using a droplet printing technique and a gas stream guiding system which comprises a first part having essentially the same diameter over essentially its entire length, and a second part having a central axis and a converging diameter over essentially its entire length in respect of the central axis in an angle ranging from 5-90°, the second part terminating at an orifice, which method comprises the steps of:
   (a) releasing a gas stream which comprises a carrier gas and droplets of a suspension of the material or droplets of a solution of a precursor of the material or droplets of a precursor of the material as such into the direction of the substrate, whereby the droplets are produced using the droplet printing technique;
   (b) maintaining a steady flow of the gas stream over a first period of time in the first part of the gas stream guiding system, wherein the Stokes number of the droplets in the gas stream is less than 1 during the first period of time;
   (c) converting the steady flow of the droplets in the gas stream into a converging flow and maintaining the converging flow of the droplets over a second period of time in the second part of the gas stream guiding system, whereby the Stokes number of the droplets in the gas stream increases up to a value higher than 10 during the second period of time and wherein the flow of droplets converges at the orifice of the second part of the gas stream guiding system; and
   (d) contacting the droplets of the suspension of the material so obtained or the droplets of a solution of a precursor of the material so obtained or droplets of a precursor of the material as such with the substrate,
   wherein the diameter of the second part at initiation of the convergence is at least 8 times larger than the diameter at termination of the convergence at the orifice; and
   wherein a heat shield is applied above the side of the substrate which is to be contacted with the droplets, the heat shield having an opening through which the droplets pass.

2. A method according to claim 1, wherein in step (b) the Stokes number of the gas stream is less than 0.1 during the first period of time.

3. A method according to claim 1, wherein in step (c) the Stokes number of the droplets in the gas stream increases up to a value higher than 25 during the second period of time.

4. A method according to claim 1, wherein in step (c) the Stokes number of the droplets in the gas stream increases up to a value higher than 30 during the second period of time.

5. A method according to claim 1, wherein the first period of time is in the range of from 0.1-10 seconds.

6. A method according to claim 1, wherein the second period of time is in the range of from 0.01-1 second.

7. A method according to claim 1, wherein the precursor comprises a metal salt or an organometallic compound and the suspension comprises a metal suspension, a polymer suspension or a ceramic suspension.

8. A method according to claims 7, wherein the metal comprises nickel, copper, gold, silver, platinum, iron, aluminium or palladium.

9. A method according to claim 8, wherein the metal comprises silver, nickel or copper.

10. A method according to claim 7, wherein the polymer comprises polystyrene, polypropylene, polyethylene, or acrylonitrile butadiene styrene.

11. A method according to claim 10, wherein the polymer comprises polystyrene or polyethylene.

12. A method according to claim 7, wherein the ceramic suspension comprises a ceramic material selected from the group consisting of aluminium oxide, zirconium oxide, magnesium oxide, boron nitride, silicon carbide, silicon nitride and tungsten carbide.

13. A method according to claim 12, wherein the ceramic material comprises aluminium oxide or zirconium oxide.

14. A method according to claim 1, wherein the droplets of the suspension of the material or the droplets of the solution of the precursor of the material are at least subjected in step (b) to a treatment which delivers energy to the droplets.

15. A method according to claim 14, wherein the treatment is carried out to establish:
   (i) that the liquid medium used in the suspension is completely or substantially removed, whereby the material is allowed to melt when the liquid medium is removed completely; or
   (ii) that the liquid medium used in the solution is completely removed, whereby pyrolysis of the precursor and melting of the material so obtained is allowed to take place when the precursor comprises a metal salt.

16. A method according to claim 15, wherein the suspension comprises a metal suspension or a polymer suspension and the liquid medium used in the suspension is completely removed.

17. A method according to claim 15, wherein the suspension comprises a ceramic suspension and the liquid medium used in the suspension is substantially removed.

18. A method according to claim 14, wherein the treatment is selected from the group consisting of heat treatments, infrared curing treatments, flash curing treatments, UV radiation treatments, electron beam curing treatments, plasma treatments, induction treatment and laser irradiation treatments.

19. A method according to claim 18, wherein the treatment is a heat treatment or a UV radiation treatment.

20. A method according to claim 1, wherein use is made of two or more printing heads or two or more nozzles that each deliver a droplet stream, resulting in two or more droplet streams that flow in parallel in the direction of the substrate.

21. A method according to claim 1, wherein step (a) comprises producing uniform droplets by a continuous droplet printing technique or a drop-on-demand droplet printing technique comprising applying a back-pressure on a reservoir of a liquid material and applying mechanical vibration to produce a stream of droplets.

22. A method according to claim 1, wherein the diameter of the second part at initiation of the convergence is 8 to 12 times larger than the diameter at termination of the convergence at the orifice.

23. A process of filling vias which are present in an electronic device comprising:
   filling one or more vias in the electronic device with a material according to the method of claim 1.

24. A process for producing conductors for use in printed circuit boards or solar cells comprising:
   depositing a conductive material on a substrate according to the method of claim 1.

\* \* \* \* \*